United States Patent
Li et al.

(10) Patent No.: US 8,759,172 B2
(45) Date of Patent: Jun. 24, 2014

(54) ETCH STOP LAYER FORMATION IN METAL GATE PROCESS

(75) Inventors: Zhengwen Li, Danbury, CT (US); Michael P. Chudzik, Danbury, CT (US); Ramachandra Divakaruni, Ossining, NY (US); Siddarth A. Krishnan, Peekskill, NY (US); Unoh Kwon, Fishkill, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/449,433

(22) Filed: Apr. 18, 2012

(65) Prior Publication Data

US 2013/0277764 A1    Oct. 24, 2013

(51) Int. Cl.
*H01L 21/336* (2006.01)

(52) U.S. Cl.
USPC .......... 438/197; 438/585; 438/692; 257/368; 257/E27.06; 257/E29.051

(58) Field of Classification Search
USPC .......... 438/287, 197, 585, 692; 257/E21.675, 257/410, 368, E27.06, E29.051
See application file for complete search history.

(56) References Cited

U.S. PATENT DOCUMENTS

| | | | |
|---|---|---|---|
| 7,759,262 B2* | 7/2010 | King et al. | 438/785 |
| 7,888,220 B2* | 2/2011 | Rachmady et al. | 438/299 |
| 8,043,907 B2* | 10/2011 | Ma et al. | 438/201 |
| 2005/0112282 A1 | 5/2005 | Gordon et al. | |
| 2007/0152252 A1* | 7/2007 | Buehler et al. | 257/295 |
| 2011/0309425 A1* | 12/2011 | Purayath et al. | 257/316 |
| 2012/0217591 A1* | 8/2012 | Kamada | 257/410 |
| 2013/0009253 A1 | 1/2013 | Wang et al. | |
| 2013/0015509 A1* | 1/2013 | Haran et al. | 257/288 |
| 2013/0020638 A1* | 1/2013 | Thompson et al. | 257/338 |
| 2013/0078791 A1 | 3/2013 | Xie et al. | |

OTHER PUBLICATIONS

Hausmann, D., et al., "Rapid Vapor Deposition of Highly Conformal Silica Nanolaminates", Science, Oct. 2012, vol. 298, No. 5592, pp. 402-406.
Rouffignac, P., et al., "Sealing Porous Low-k Dielectrics with Silica", Electrochemical and Solid-State Letters, Oct. 2004, vol. 7, Issue 12.
U.S. Office Action dated Jan. 3, 2014 received in related U.S. Patent Application, namely U.S. Appl. No. 13/780,957.

* cited by examiner

*Primary Examiner* — Jarrett Stark
*Assistant Examiner* — Shahed Ahmed
(74) *Attorney, Agent, or Firm* — Scully, Scott, Murphy & Presser, P.C.; H. Daniel Schnurmann

(57) ABSTRACT

A method of forming a semiconductor device that includes forming a metal gate conductor of a gate structure on a channel portion of a semiconductor substrate. A gate dielectric cap is formed on the metal gate conductor. The gate dielectric cap is a silicon oxide that is catalyzed by a metal element from the gate conductor so that edges of the gate dielectric cap are aligned with a sidewall of the metal gate conductor. Contacts are then formed to at least one of a source region and a drain region that are on opposing sides of the gate structure, wherein the gate dielectric cap obstructs the contacts from contacting the metal gate conductor.

11 Claims, 1 Drawing Sheet

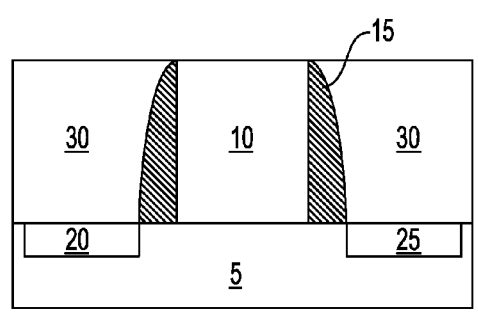
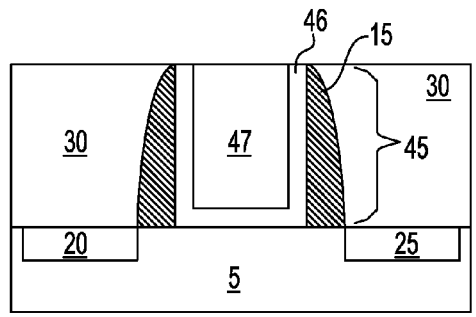
FIG. 1         FIG. 2
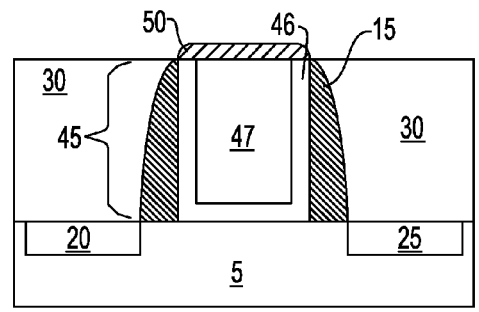
FIG. 3
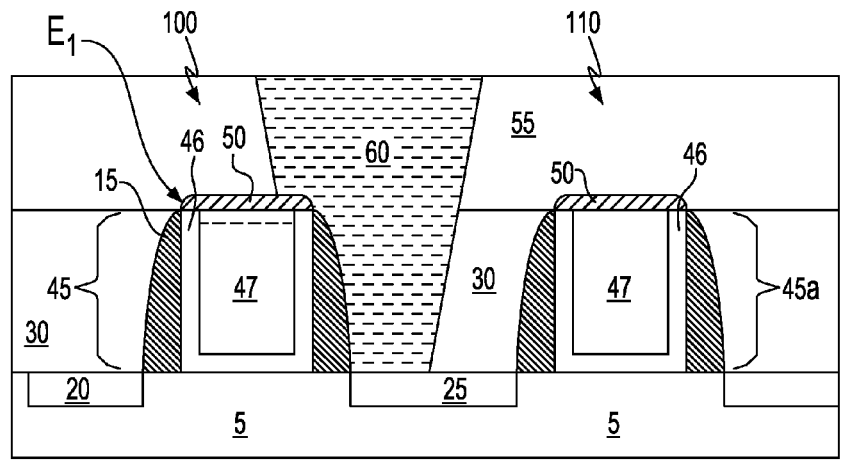
FIG. 4

ETCH STOP LAYER FORMATION IN METAL GATE PROCESS

BACKGROUND

The present disclosure relates generally to semiconductor integrated circuits. More particularly, the present disclosure relates to scaling of semiconductor devices, such as metal oxide semiconductor field effect transistors (MOSFETs). In order to be able to make integrated circuits, such as memory, logic, and other devices, of higher integration density than currently feasible, one has to find ways to further downscale the dimensions of field effect transistors (FETs), such as MOSFETs and complementary metal oxide semiconductors (CMOS). Scaling achieves compactness and improves operating performance in devices by shrinking the overall dimensions of the device.

SUMMARY

In one embodiment, a semiconductor device is formed by a method that includes forming a metal gate conductor of a gate structure on a channel portion of a semiconductor substrate, wherein the metal gate conductor is comprised of a catalytic metal. A gate dielectric cap comprising at least silicon and oxygen is formed on the metal gate conductor. The gate dielectric cap is catalyzed by the catalytic metal so that edges of the gate dielectric cap are aligned with a sidewall of the metal gate conductor. Contacts are then formed to at least one of a source region and a drain region that are on opposing sides of the gate structure, wherein the gate dielectric cap obstructs the contacts from contacting the metal gate conductor.

In another aspect, a semiconductor device is provided that includes a gate structure on a channel portion of a semiconductor substrate. The gate structure includes at least one gate dielectric in contact with the channel portion of the semiconductor substrate and a gate conductor comprised of a catalytic metal. The at least one gate dielectric has a U-shaped geometry. A gate dielectric cap is present on the gate conductor, wherein the gate dielectric cap has edges that are substantially self-aligned to sidewalls of the gate conductor. The gate dielectric cap comprises at least silicon and oxygen and has a self-limited thickness of less than 20 nm. A source region and a drain region are present on opposing sides of the gate structure. A contact is present to each of the source region and the drain region. The contact is separated from the gate conductor by at least the gate conductor.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which:

FIG. 1 is a side cross-sectional view depicting one embodiment of an initial structure of the disclosed method including a replacement gate structure on a semiconductor substrate, a source region and a drain region present in the semiconductor substrate on opposing sides of the sacrificial gate structure, and a spacer adjacent to the sacrificial gate structure, in accordance with the present disclosure.

FIG. 2 is a side cross-sectional view depicting one embodiment of removing the replacement gate structure to provide an opening to a channel portion of the semiconductor substrate, and forming a functional gate structure in the opening, wherein the functional gate structure includes at least one gate dielectric and at least one gate conductor.

FIG. 3 is a side cross-sectional view depicting one embodiment of forming a gate dielectric cap on the metal gate conductor, wherein the gate dielectric cap is a silicon oxide, or doped silicon oxide, with dopants being carbon, nitrogen, hydrogen or combined mixtures that is catalyzed by a metal element from the catalytic metal so that edges of the gate dielectric cap are aligned with a sidewall of the metal gate conductor.

FIG. 4 is a side cross-sectional view depicting one embodiment of forming a contact to the source and drain regions of the semiconductor device.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawing figures.

It has been determined that one consequence of scaling semiconductor devices, such as field effect transistors (FETs), is that as the distance between adjacent semiconductor devices is decreased it is becomes increasingly difficult to form interconnects to the source region and the drain region without shorting the gate structures. In one aspect, the present disclosure provides a process sequence for manufacturing a semiconductor device that forms a dielectric gate cap atop a metal gate conductor composed of a catalytic metal, in which the catalytic metal functions as a catalyst to selective deposition of the dielectric material of the dielectric gate cap on only the metal gate conductor in a self-aligned manner. More specifically, by self-aligned it is meant that the deposited material of the dielectric gate cap is deposited continuously atop the entire upper surface of the metal gate conductor, wherein the edges of the dielectric gate cap are aligned to the sidewalls of the metal gate conductor. In one embodiment, the catalytic metal that dictates the self-aligned characteristics of the dielectric gate cap also provides that the dielectric gate cap has a self-limiting thickness.

FIG. 1 illustrates the results of initial processing steps of the present disclosure that produce a replacement gate structure 10 on a semiconductor substrate 5 including a source region 20 and a drain region 25 present in the semiconductor substrate 5 on opposing sides of the replacement gate structure 10, at least one dielectric spacer 15 adjacent to the replacement gate structure 10, and an interlevel dielectric layer 30 adjoining the replacement gate structure 10 and located on the exposed surface of the semiconductor substrate 5. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

Still referring to FIG. 1, the replacement gate structure 10 is formed on the channel portion of the semiconductor substrate 5. As used herein, the term "replacement gate structure 10" denotes a sacrificial structure that dictates the geometry and location of the later formed functioning gate structure. The functional gate structure controls output current, i.e., flow of carriers in the channel region of the semiconductor device. The channel region is the region between the source region and the drain region of the semiconductor device that becomes conductive when the transistor is turned on. The sacrificial material that provides the replacement gate structure 10 may be composed of any material that can be etched selectively to the bottom dielectric films or semiconductor substrate 5. In one embodiment, the sacrificial material that provides the replacement gate structure 10 may be composed of a silicon-containing material, such as polysilicon. Although, the replacement gate structure 10 is typically composed of a semiconductor material, the replacement gate structure 10 may also be composed of doped Si layers with Ge, or a dielectric material, such as amorphous carbon. The sacrificial material may be patterned and etched to provide the replacement gate structure 10. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the replacement gate structure 10, while the exposed regions are removed using a selective etching process that removes the unprotected regions. Following formation of the replacement gate structure 10, the photoresist may be removed.

At least one dielectric gate spacer 15 may then be formed adjacent to the replacement gate structure 10, i.e., in direct contact with the sidewall of the replacement gate structure 10. In one embodiment, the at last one dielectric gate spacer 15 may be formed by using a blanket layer deposition, such as chemical vapor deposition, and an anisotropic etchback method. The at least one dielectric gate spacer 15 may have a width ranging from 2.0 nm to 15.0 nm, and may be composed of a dielectric, such as a nitride, oxide, oxynitride, or a combination thereof. The dielectric gate spacer 15 is optional, and may be omitted.

In some embodiments, a source region 20 and a drain region 25 may then be formed in the portions of the semiconductor substrate 5 that are present on opposing sides of replacement gate structure 10. In one embodiment, the source region 20 and the drain region 25 are formed using an ion implantation process. The conductivity type, e.g., n-type or p-type, of the source region 20 and the drain region 25 typically dictates the conductivity type of the semiconductor device, e.g., nFET or pFET. In a silicon-containing semiconductor substrate 5, examples of p-type dopants, i.e., impurities, include but are not limited to, boron, aluminum, gallium and indium, and examples of n-type dopants, i.e., impurities, include but are not limited to antimony, arsenic and phosphorous.

Still referring to FIG. 1, in one embodiment, a first interlevel dielectric layer 30 is formed atop the source region 20 and the drain region 25, wherein the upper surface of the interlevel dielectric layer 30 is coplanar with an upper surface of the replacement gate structure 10. The composition of the first interlevel dielectric layer 30 may be selected from the group consisting of silicon-containing materials such as $SiO_2$, $Si_3N_4$, $SiO_xN_y$, SiC, SiCO, SiCOH, SiCBN and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). The first interlevel dielectric layer 30 may be formed using a deposition method such as chemical vapor deposition (CVD) or spin on deposition. Following deposition the first interlevel dielectric layer 30 may be planarized, e.g., planarized by chemical mechanical planarization (CMP), so that an upper surface of the first interlevel dielectric layer 30 is coplanar with an upper surface of the replacement gate structure 10.

FIG. 2 depicts one embodiment of removing the replacement gate structure 10 to provide an opening to a channel portion of the semiconductor substrate 5, and forming a functional gate structure 45 in the opening. The etch process for removing the replacement gate structure 10 may be a selective etch. As used herein, the term "selective" in reference to a material removal process denotes that the rate of material removal for a first material is greater than the rate of removal for at least another material of the structure to which the material removal process is being applied. For example and in one embodiment, a selective etch may include an etch chemistry that removes a first material selectively to a second material by a ratio of 2:1 or greater, such as 5:1. The replacement gate structure 10 may be removed using a wet or dry etch process, such as reactive ion etch (RIE), or combination of these techniques thereof. In one example, an etch step for removing the replacement gate structure 10 can include an etch chemistry for removing the replacement gate structure 10 selective to the substrate dielectrics or semiconductor substrate 5.

Still referring to FIG. 2, the functional gate structure 45 includes at least one gate dielectric 46 and at least one gate conductor 47. The at least one gate dielectric 46 may be composed of any dielectric material including oxides, nitrides and oxynitrides. In one embodiment, the at least one gate dielectric 46 may be provided by a high-k dielectric material. The term "high-k" as used to describe the material of the at least one gate dielectric 46 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the dielectric constant of the high-k dielectric material may be greater than 10.0. In one embodiment, the at least one gate dielectric 46 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof.

In one embodiment, the at least one gate dielectric 46 may be deposited by chemical vapor deposition (CVD), such as plasma enhanced CVD (PECVD). In one embodiment, the at least one gate dielectric 46 may be deposited using a conformal deposition method. The term "conformal" denotes a layer having a thickness that does not deviate from greater than or less than 20% of an average value for the thickness of the layer. In one embodiment, the thickness of the at least one gate dielectric 46 ranges from 0.8 nm to 6.0 nm. In one embodiment, the side cross-section of at least one gate dielectric 46 has a U-shaped geometry, as depicted in FIG. 2, in which a portion of the at least one gate dielectric 46 extends along an entire height of the interior sidewalls of the dielectric spacer 15 and a portion of the at least one gate dielectric 46 is present on the surface of the semiconductor substrate 5 that includes the device channel.

The at least one metal gate conductor 47 is formed on the at least one gate dielectric 46. The at least one metal gate conductor 47 is composed of a catalytic metal. A "catalytic metal" is a metal that provides for a polymerization reaction with the precursor of the atomic layer deposition (ALD) half reaction for forming the gate dielectric cap that is self-aligned to the metal gate conductor. In one embodiment, the catalytic metal is a Lewis-acid type metal. As used herein, a "Lewis-acid type metal" is a metal ion that functions as an electron pair acceptor in the formation of a stable substance. Examples of catalytic metals include aluminum (Al), hafnium (Hf), zirconium (Zr), titanium (Ti), tantalum (Ta), tungsten (W) and a combination thereof. The at least one metal gate conductor 47 may be formed by a deposition process, such as CVD, plasma-assisted CVD, plating, and/or sputtering, followed by planarization. More specifically, in one embodiment, the at least one metal gate conductor 47 may be deposited filling the opening produced by removing the replacement gate structure 10.

FIG. 3 depicts one embodiment of forming a gate dielectric cap 50 on the at least one metal gate conductor 47, wherein the gate dielectric cap 50 is a silicon and oxygen containing dielectric that is catalyzed by the catalytic metal of the gate conductor 471 so that edges E1 of the gate dielectric cap 50 are substantially aligned with a sidewall of the at least one metal gate conductor 47. By "substantially aligned" it is mean that the sidewall of edge E1 of the gate dielectric cap 50 may extend from the sidewall of the at least one metal gate conductor 47 by a dimension of 20 nm or less. The catalytic effect provided by the catalytic metal means that there is substantially no deposition of the material for the gate dielectric cap 50 grown on the first interlevel dielectric layer 30 and the semiconductor substrate. The material for the gate dielectric cap 50 is only deposited on the upper surface of the at least one metal gate conductor 47 of the catalytic metal. More specifically, in some embodiments, the ALD half reaction deposition process, which will be described in more detail below, provides for a self limiting thickness of 20 nm or less. Therefore, because the material of the gate dielectric cap 50 can only extend from the catalytic metal that provides the at least one metal gate conductor 47, the maximum amount of lateral growth of the gate dielectric cap 50 can be 20 nm, which allows for some overlap of the dielectric spacers 15 or lateral extension to first interlevel dielectric layer 30. The material of the gate dielectric cap 50 is not grown on an exterior surface of the first interlevel dielectric layer 30. The gate dielectric cap 50 may provide an etch stop layer to protect the at least one metal gate conductor 47 during subsequent etch steps to form vias to the source region 20 and drain region 25, for the subsequently formed contacts; i.e., interconnects.

The gate dielectric cap 50 may be formed using an atomic layer deposition (ALD) half reaction. Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. The atomic layer depsoition (ALD) process of the present disclosure uses only half reactions to deposit the gate dielectric cap 50. The precusor of the atomic layer deposition process may be a silicon containing precursor. In some embodiments, the percursor may have the following chemical formulation:

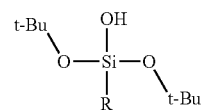

In one embodiment, in which R in the above chemical formula is equal to an alkyloxy group, the precursor may be tris(tert-butyloxyl)silanol. In another embodiment, in which R in the above chemical formula is a butyl group, such as tert-butyl, the precursor may be at least one of bis(tert-butyloxyl)alkyl silanol, and mono-tert-butyloxyl alkyl silanol. Other butyl groups that are suitable for R in the above chemical formula include n-butyl, iso-butyl, and sec-butyl. It is noted that the above examples are provided for illustrative purposes only, as the R group in the above chemical formula for the precursor of the ALD half reaction may be any group having a carbon chain. For example, the R group in the above chemical formula may be an alkyl group, such as methyl group, ethyl group, propyl group, n-propyl group, isopropyl group, pentyl group, hexyl group, octyl group and combinations thereof.

In one example, in which the silicon precursor of the ALD half reaction process is tris (tert-butyloxyl)silanol, the deposited gate dielectric cap 50 is composed of silicon oxide (SiO$_2$). In another example, in which the silicon precursor of the ALD half reaction process is bis(tert-butyloxyl)alkyl silanol, the deposited gate dielectric cap 50 is silicon-oxycarbide (SiCO). In another example, in which the silicon precursor of the ALD half reaction process is bis-tert-butyloxyl-aminoalkyl silanol, the gate dielectric cap 50 comprises silicon carbon nitro-oxide (SiCNO).

The ALD half reaction using one of the above described precursors is a self-aligned and self-limiting deposition process. For example, in some embodiments, the above described precursor gasses are chemisorbed by the catalytic metal of the at least one metal gate conductor 47, wherein the silanol molecules can then diffuse into the catalytic metal. Repeated insertion of the silanol molecules into the catalytic metal of the at least one metal gate conductor 47 form a siloxane polymer bound to the surface of the at least one metal gate conductor 47 through the catalytic metal, e.g., aluminum. This siloxane polymer is attached to the surface by strong chemical bonds and is thus non-volatile, i.e., a chemisorbed material. Because silanol can diffuse through this soft, surface bound siloxane polymer, the catalytic metal remains available to catalyze the polymerization of the silanol molecules. The self-aligned and rate-limiting mechanism in this process is the catalytic conversion of silanol to siloxane, provided that the concentration of silanol vapor is sufficiently high to keep the catalytic aluminum atoms fully occupied. In this case, the chemisorption rate does not depend on the rate at which silanol arrives at the surface of the siloxane layer. In the language of chemical kinetics, the chemisorption rate is zero order in the vapor concentration of silanol. The self aligned and self-limiting nature of the ALD half reaction results from cross-linking of the siloxane polymer.

More specifically, the cross-linking reactions connect the siloxane polymer chains, causing the polymer layer to gel and eventually solidify. For example, in the embodiments in which the precursor of the ALD half reaction is tris(tert-butyloxyl)silanol, the polymer layer may solidify to form silica ($SiO_2$). In another example, in which the precursor of the ALD half reaction is bis(tert-butyloxyl)alkyl silanol, the polymer layer may solidify to form silicon-oxycarbide (SiCO). In yet another example, in which the precursor of the ALD half reaction is mono-tert-butyloxyl alkyl silanol, the polymer layer may solidify to form silicon carbon nitro-oxide (SiCNO). Because the silanol presumably has a negligible rate of diffusion through solid silica, silicon-oxycarbide (SiCO) or silicon carbon nitro-oxide (SiCNO), additional silanol can no longer reach the catalytic metal, e.g., aluminum, so the chemisorption stops, i.e., becomes self-limited. By "self-limiting" or "self-limited" it is meant that the amount of film material deposited in each reaction cycle of the ALD deposition is constant. One ALD half reaction may take from 0.5 seconds to a few seconds and may deposit a gate dielectric cap 50 having a self limited thickness between 1.0 nm and 20 nm. In another embodiment, the gate dielectric cap 50 has a self limited thickness that ranges from 1.0 nm to 10 nm. The self-limited thickness may be provided by one ALD half reaction cycle. Further details regarding one embodiment of the ALD half reaction process that provides the self-aligned and self-limited gate dielectric cap 50 may be found in Hausmann et al. "Rapid Vapor Deposition of Highly Conformal Silica Nanolaminates", Science, Vol. 498, p. 402 (Oct. 11, 2002).

FIG. 4 depicts one embodiment of forming a contact 60 to the source region 20 and the drain region 25 of the semiconductor device 100. In one embodiment, a second interlevel dielectric layer 55 is deposited over the structure depicted in FIG. 3, and contacts 60 are formed to the source regions 20 and drain regions 25 of the semiconductor device 100. The composition of the second interlevel dielectric layer 55 may be similar to the first interlevel dielectric layer 30 that is described above with reference to FIG. 1. Therefore, the description of the first interlevel dielectric layer 30 that is described above with respect to FIG. 1 is suitable for the second interlevel dielectric layer 55 that is depicted in FIG. 4.

Via openings may be formed to expose an upper surface of the source region 20 and the drain region 25. The via openings may be formed using photolithography and etch processes. For example, a photoresist etch mask can be produced by applying a photoresist layer to the upper surface of the second interlevel dielectric layer 55, exposing the photoresist layer to a pattern of radiation, and then developing the pattern into the photoresist layer utilizing a resist developer. The photoresist etch mask may be positioned so that the portions of the second interlevel dielectric layer 55 that are not protected by the photoresist etch mask may be etched in order to provide the via openings. The exposed portion of the second interlevel dielectric layer 55 is then removed by a selective etch. The etch that removes the exposed portions of the second interlevel dielectric layer 55 is selective to at least the gate dielectric cap 50, and may also be selective to the dielectric spacers 15 and the semiconductor substrate 5. The etch that removes the exposed portion of the second interlevel dielectric layer 55 may be an anisotropic etch. Examples of anisotropic etch process suitable for forming the via openings include, but are not limited to, reactive-ion etching (RIE), ion beam etching, plasma etching and/or laser ablation. Contacts 60 may be formed in the via openings, in which the contacts 60 are in direct contact with the upper surface of the source region 20 and the drain region 25. Contacts 60 are formed by depositing a conductive metal into the via openings using a deposition process, such as physical vapor deposition (PVD), such as sputtering and plating. The contact 60 may be composed of conductive metals, such as titanium/titanium nitride/tungsten, tantalum nitride/tantalum/copper, manganese, aluminum, silver, gold, and alloys thereof. Following the formation of the contacts 60, a separate contact may be formed to the at least one metal gate conductor 47.

Referring to FIG. 4, in one embodiment a semiconductor device 100 is provided that includes a functional gate structure 45 on a channel portion of a semiconductor substrate 5. The gate structure 45 includes at least one gate dielectric 46 having a U-shaped geometry in contact with the channel portion of the semiconductor substrate 5 and a metal gate conductor 47 comprised of a catalytic metal. The gate dielectric cap 50 has edges E1 that are self-aligned to sidewalls of the gate conductor 47. The gate dielectric cap 50 typically has a self-limiting thickness of less than 20 nm. In one embodiment, the gate dielectric cap 50 has a thickness ranging from 1 nm to 15 nm. In one embodiment, an interface oxide may be present between the gate dielectric cap 5 and the catalytic metal of the metal gate conductor 47. The interface oxide 51 includes a metal element from the catalytic metal. In one embodiment, in which the catalytic metal is composed of aluminum (Al), the interface oxide 51 is comprised of aluminum oxide ($Al_2O_3$).

Still referring to FIG. 4, the gate dielectric cap 50 protects the gate conductor 47 from being shorted to the source region 25 and the drain region 30 by the contact 60, because the gate dielectric cap 50 separates the contact 60 from the metal gate conductor 47. Therefore, the gate dielectric cap 50 prevents shorting between the contact 60 to the source region 25 and the drain region 30 and the metal gate conductor 47 with increased scaling of the semiconductor device 100. For example, the methods and structures disclosed herein may be applicable to semiconductor devices 100, 110 separated by a pitch between adjacent gate structures 45, 45a ranging from 30 nm to 100 nm.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a semiconductor device comprising:
   forming a metal gate conductor of a gate structure on a channel portion of a semiconductor substrate, wherein the metal gate conductor is comprised of a catalytic metal;
   forming a gate dielectric cap on the metal gate conductor with an atomic layer deposition process that includes only half reactions of a silanol containing precursor, the gate dielectric cap comprised of at least silicon and oxygen, wherein the gate dielectric cap is catalyzed by the catalytic metal so that edges of the gate dielectric cap are aligned with a sidewall of the metal gate conductor, wherein the thickness of the gate dielectric cap is self limited to less than 20 nm; and
   forming contacts to at least one of a source region and a drain region that are on opposing sides of the gate structure, wherein the gate dielectric cap obstructs the contacts from contacting the metal gate conductor.

2. The method of claim 1, wherein the gate dielectric cap comprises $SiO_2$, SiCO, SiCNO, SiON or a combination thereof.

3. The method of claim 1, wherein the gate structure further comprises a gate dielectric layer between the channel portion of the semiconductor substrate and the metal gate conductor.

4. The method of claim 3, wherein forming of the metal gate conductor comprises:
   forming a replacement gate structure on the channel portion of the semiconductor substrate;
   forming a dielectric spacer on opposing sides of the replacement gate structure;
   forming the source region and the drain region in the semiconductor substrate;
   forming an interlevel dielectric over the semiconductor substrate having an upper surface that is coplanar with the replacement gate structure;
   removing the sacrificial gate structure to provide an opening to the channel portion of the semiconductor substrate;
   forming the gate dielectric layer on sidewalls of the opening and a base of the opening on the channel portion of the semiconductor substrate; and
   forming the metal gate conductor on the gate dielectric layer filling the opening.

5. The method of claim 4, wherein the replacement gate structure is comprised of a aluminum containing gate conductor.

6. The method of claim 1, wherein the catalytic metal is selected from the group consisting of aluminum (Al), hafnium (Hf), zirconium (Zr), titanium (Ti), tantalum (Ta), tungsten (W) and a combination thereof.

7. The method of claim 1, wherein the catalytic metal is deposited by sputtering.

8. The method of claim 1, wherein the silanol containing precursor comprises tris (tert-butyloxyl) silanol and the gate dielectric cap comprises silicon oxide.

9. The method of claim 1, wherein the silanol containing precursor comprises bis (tert-butyloxyl) alkyl silanol and the gate dielectric cap comprises silicon-oxycarbide (SiCO).

10. The method of claim 1, wherein the silanol containing precursor comprises bis-(tert-butyloxyl aminoalkyl silanol and the gate dielectric cap comprises silicon carbon nitro-oxide (SiCNO).

11. The method of claim 4, wherein the forming of the contacts comprises etching a via opening through the interlevel dielectric to each of the source region and the drain region, wherein the etching is selective to the gate dielectric cap, the dielectric spacer, and the source region and the drain region; and
   forming the interconnect in each via opening in direct contact with each of the source region and the drain region.

* * * * *